United States Patent
Yamauchi et al.

(10) Patent No.: US 9,214,445 B2
(45) Date of Patent: Dec. 15, 2015

(54) ELECTRONIC COMPONENT AND METHOD OF FABRICATING THE SAME

(71) Applicant: TAIYO YUDEN CO., LTD., Tokyo (JP)

(72) Inventors: Motoi Yamauchi, Kanagawa (JP);
Osamu Kawachi, Kanagawa (JP);
Yasushi Fukuda, Kanagawa (JP);
Yoshinobu Ishibashi, Kanagawa (JP)

(73) Assignee: TAIYO YUDEN CO., LTD., Tokyo (JP)

(*) Notice: Subject to any disclaimer, the term of this patent is extended or adjusted under 35 U.S.C. 154(b) by 0 days.

(21) Appl. No.: 14/231,163

(22) Filed: Mar. 31, 2014

(65) Prior Publication Data
US 2014/0339695 A1 Nov. 20, 2014

(30) Foreign Application Priority Data

May 16, 2013 (JP) .................................. 2013-104570
Aug. 7, 2013 (JP) .................................. 2013-164474

(51) Int. Cl.
*H01L 23/00* (2006.01)
*H05K 1/02* (2006.01)
*H03H 9/05* (2006.01)
*H01L 23/15* (2006.01)
(Continued)

(52) U.S. Cl.
CPC ............... *H01L 24/81* (2013.01); *H01L 24/83* (2013.01); *H01L 24/97* (2013.01); *H05K 1/0271* (2013.01); *H01L 23/15* (2013.01); *H01L 24/13* (2013.01); *H01L 24/16* (2013.01); *H01L 2224/13111* (2013.01); *H01L 2224/16238* (2013.01); *H01L 2224/7598* (2013.01); *H01L 2224/81007* (2013.01); *H01L 2224/81191* (2013.01); *H01L 2224/81203* (2013.01); *H01L 2224/81206* (2013.01); *H01L 2224/81207* (2013.01); *H01L 2224/81815* (2013.01);
(Continued)

(58) Field of Classification Search
CPC ................................. H01L 24/17; H01L 24/81
USPC .......................................................... 257/737
See application file for complete search history.

(56) References Cited

U.S. PATENT DOCUMENTS 5,900,312 A * 5/1999 Sylvester .................... 428/322.7
2006/0208365 A1* 9/2006 Shen et al. ..................... 257/778
(Continued)

FOREIGN PATENT DOCUMENTS

JP   2003-060334 A   2/2003
JP   2010-010165 A   1/2010

OTHER PUBLICATIONS

English Translation for JP2010010165A, Matsuo Ko, Electronic component module, Jan. 14, 2010.*

*Primary Examiner* — Christine Enad
(74) *Attorney, Agent, or Firm* — Chen Yoshimura LLP

(57) ABSTRACT

An electronic component includes: a substrate formed of ceramic and including one or more pads on an upper surface thereof; a component flip-chip mounted on the upper surface of the substrate with one or more bumps bonded to the one or more pads; and an additional film located on a lower surface of the substrate and overlapping with at least a part of a smaller one of the pad and the bump in each of one or more pad/bump pairs, the one or more pad/bump pairs being composed of the one or more pads and the one or more bumps bonded to each other.

4 Claims, 19 Drawing Sheets

(51) Int. Cl.
*H05K 1/03* (2006.01)
*H05K 3/34* (2006.01)

(52) U.S. Cl.
CPC ............... *H01L 2224/83007* (2013.01); *H01L 2224/83191* (2013.01); *H01L 2224/83203* (2013.01); *H01L 2224/83815* (2013.01); *H01L 2224/97* (2013.01); *H01L 2924/351* (2013.01); *H03H 9/059* (2013.01); *H05K 1/0306* (2013.01); *H05K 3/3431* (2013.01); *H05K 2201/09781* (2013.01); *H05K 2201/2009* (2013.01)

(56) References Cited

U.S. PATENT DOCUMENTS

| | | | |
|---|---|---|---|
| 2008/0173997 A1* | 7/2008 | Kobayashi | 257/679 |
| 2008/0284315 A1* | 11/2008 | Tasumi et al. | 313/503 |
| 2013/0057361 A1* | 3/2013 | Sakano et al. | 333/193 |
| 2013/0187723 A1* | 7/2013 | Harima et al. | 331/158 |
| 2013/0271929 A1* | 10/2013 | Malatkar et al. | 361/748 |
| 2014/0078700 A1* | 3/2014 | Masuyama et al. | 361/760 |
| 2014/0252591 A1* | 9/2014 | Yu et al. | 257/729 |

* cited by examiner

ELECTRONIC COMPONENT AND METHOD OF FABRICATING THE SAME

CROSS-REFERENCE TO RELATED APPLICATION

This application is based upon and claims the benefit of priority of the prior Japanese Patent Application No. 2013-104570, filed on May 16, 2013, and the prior Japanese Patent Application No. 2013-164474, filed on Aug. 7, 2013, the entire contents of which are incorporated herein by reference.

FIELD

A certain aspect of the present invention relates to an electronic component and a method of fabricating the same.

BACKGROUND

Communication devices such as mobile phones employ an acoustic wave device such as a surface acoustic wave (SAW) device functioning as a filter or a duplexer, a chip component including an inductor and a capacitor, and an electronic component including semiconductor devices such as a power amplifier (PA) and a switch. To reduce the size and the height of the electronic component, a SAW device and a semiconductor device are sometimes flip-chip mounted on a substrate. Japanese Patent Application Publication No. 2003-60334 discloses an invention in which an LC filter and a chip component are mounted on a substrate. Japanese Patent Application Publication No. 2010-10165 discloses an electronic component module equipped with a sensor element and a semiconductor element and used to measure a pressure of a tire.

When a component such as a SAW device or a semiconductor device is flip-chip mounted, heat is applied for connecting bumps, and pressure is further applied to the component. Stress is also applied to the substrate due to the pressure, and the substrate may be damaged.

SUMMARY OF THE INVENTION

According to an aspect of the present invention, there is provided an electronic component including: a substrate formed of ceramic and including one or more pads on an upper surface thereof; a component flip-chip mounted on the upper surface of the substrate with one or more bumps bonded to the one or more pads; and an additional film located on a lower surface of the substrate and overlapping with at least a part of a smaller one of the pad and the bump in each of one or more pad/bump pairs composed of the one or more pads and the one or more bumps bonded to each other.

According to another aspect of the present invention, there is provided a method of fabricating an electronic component including: forming an additional film on a lower surface of a substrate formed of ceramic; and flip-chip mounting a component so that the additional film overlaps with at least a part of a smaller one of a pad and a bump in each of one or more pad/bump pairs by bonding one or more bumps to one or more pads located on an upper surface of the substrate after the forming of the additional film, the one or more pad/bump pairs being composed of the one or more pads and the one or more bumps bonded to each other.

DETAILED DESCRIPTION

A description will now be given of embodiments with reference to the drawings.

First Embodiment

Figure 1A:
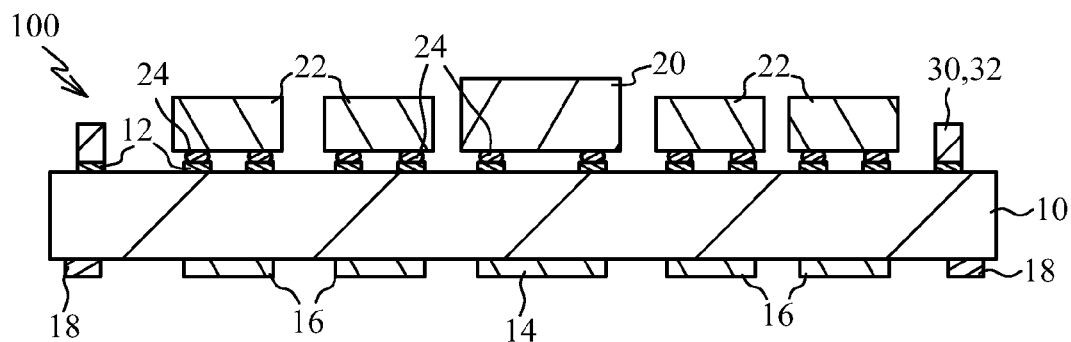
FIG. 1A is a cross-sectional view illustrating an electronic component in accordance with a first embodiment.
Figure 1B:
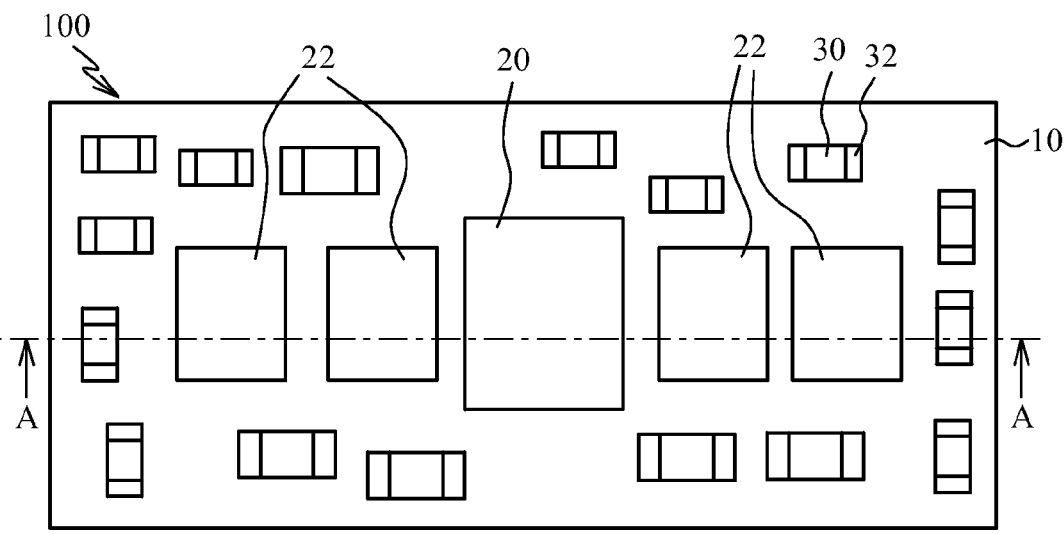
FIG. 1B is a top view illustrating the electronic component.
Figure 1C:
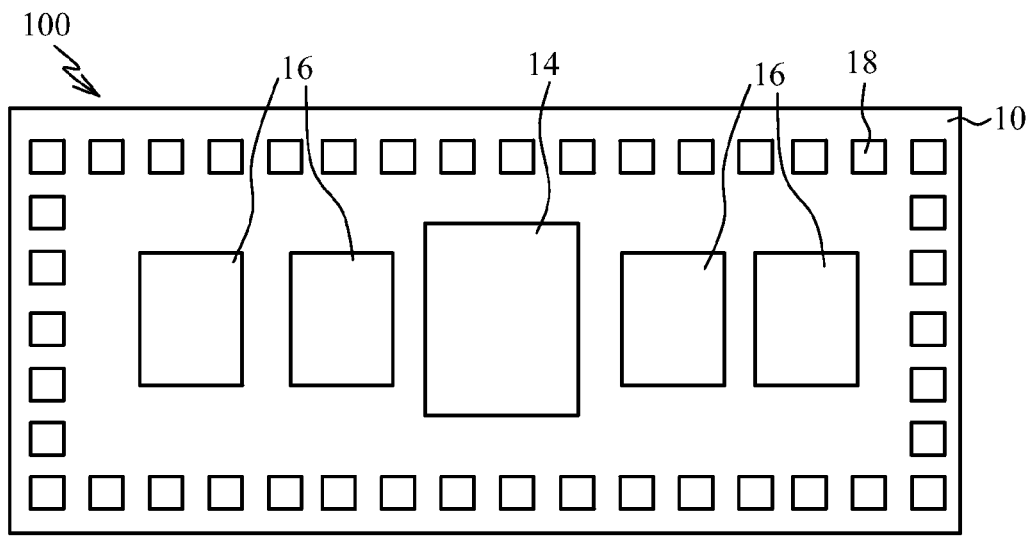
FIG. 1C is a bottom view illustrating the electronic component.

FIG. 1A is a cross-sectional view illustrating an electronic component 100 in accordance with a first embodiment, and illustrates a cross-section taken along line A-A in FIG. 1B. FIG. 1B is a top view illustrating the electronic component 100. FIG. 1C is a bottom view illustrating the electronic component 100.

As illustrated in FIG. 1A and FIG. 1B, the electronic component 100 includes a substrate 10, a semiconductor device 20, SAW devices 22, and chip components 30. Pads 12 are located on the upper surface of the substrate 10, and pads 14, 16 and 18 are located on the lower surface. On the upper surface of the substrate 10, flip-chip mounted are the semiconductor device 20 and the SAW devices 22, and also mounted are the chip components 30. The semiconductor device 20 and the SAW devices 22 are electrically connected to the pads 12 by bumps 24 while the chip components 30 are electrically connected to the pads 12 by solder 32. The bump 24 has a diameter R1 less than the width W1 of the pad 12. As illustrated in FIG. 1A and FIG. 1C, the pad 14 are located below the semiconductor device 20, and each of the pad 16 is located below the corresponding SAW device 22. The pads 18 are located along the edge of the substrate 10 to surround the pads 14 and 16. The pads 18 are electrically connected to the semiconductor device 20, the SAW devices 22, and the chip components 30, and used for inputting and outputting signals between the electronic component 100 and an external substrate. The SAW device 22 is, for example, a SAW filter or a duplexer including a receive filter and a transmit filter. The semiconductor device 20 function as a power amplifier or a switch. The chip component 30 includes passive elements such as an inductor and a capacitor, and matches impedance between an unillustrated antenna and the semiconductor device 20 and the SAW devices 22.

Figure 2A:
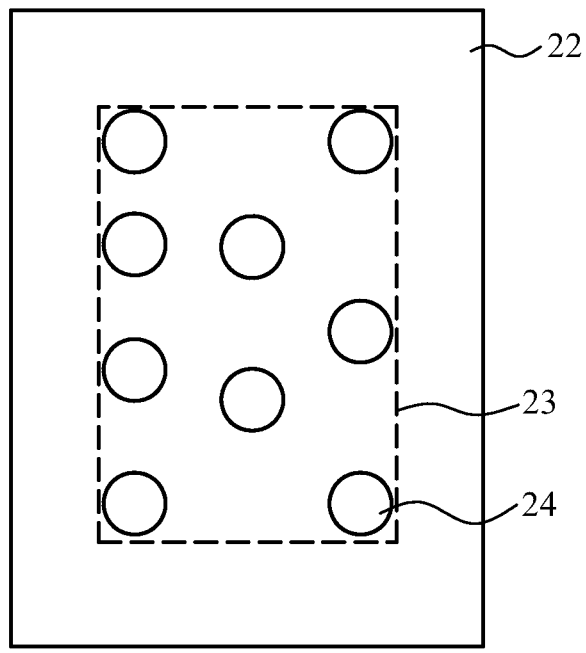
FIG. 2A is a diagram illustrating a lower surface of a SAW device.
Figure 2B:
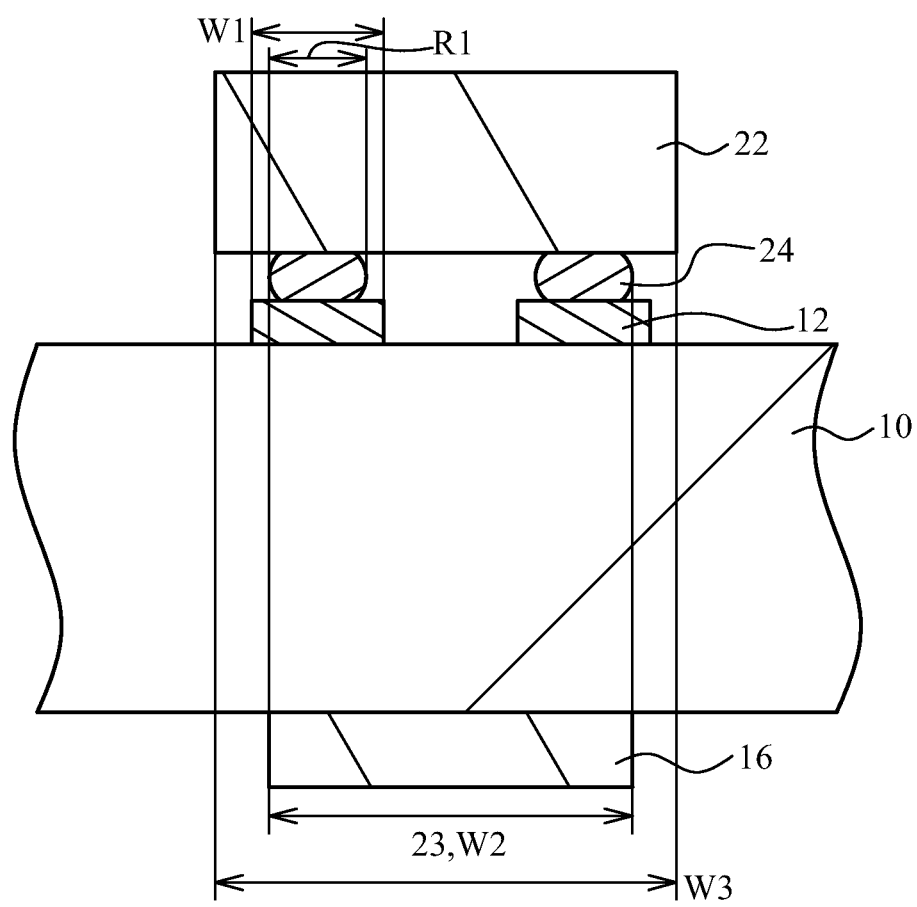
FIG. 2B is an enlarged cross-sectional view of the SAW device.

FIG. 2A is a diagram illustrating the lower surface of the SAW device 22. As illustrated in FIG. 2A, the bumps 24 are located on the lower surface of the SAW device 22. A region surrounded by the bumps 24 of the SAW device 22 is referred to as a region 23, and indicated by a dotted line in FIG. 2A. FIG. 2B is an enlarged cross-sectional view of the SAW device 22. As illustrated in FIG. 2B, the pad 16 has a width W2 equal to the width of the region 23. The SAW device 22 has a width W3 greater than the width W2. Although the illustration is omitted, the bumps 24 are also located on the lower surface of the semiconductor device 20. The pad 14 has a width equal to the width of the region surrounded by the bumps 24 in the semiconductor device 20.

The substrate 10 is formed of an insulating material such as ceramic. The bump 24 is formed of solder composed mostly of, for example, tin silver (Sn—Ag). The pads 12, 14, 16 and 18 include, for example, copper (Cu), silver (Ag), tungsten (W), and molybdenum (Mo), and their surfaces are formed of gold (Au) having high wettability with solder.

Figure 3A:
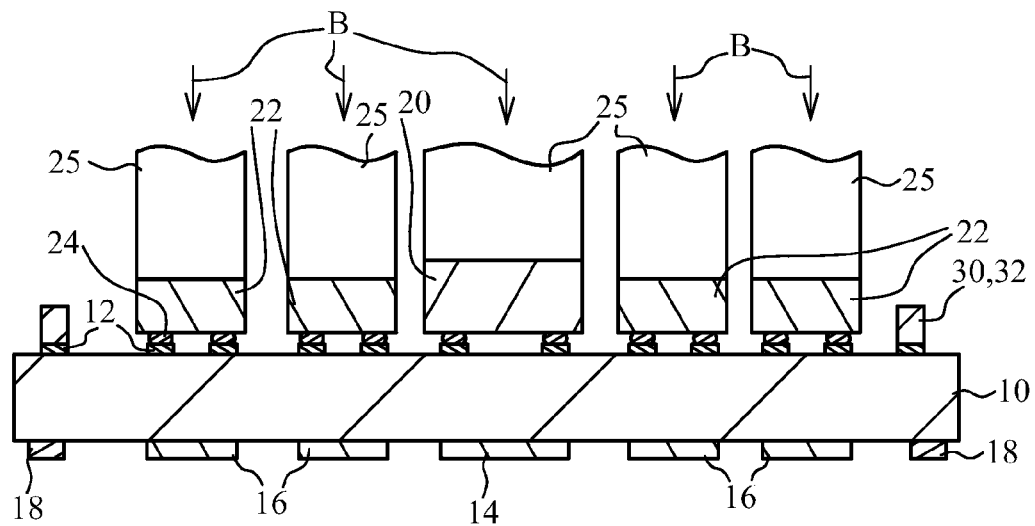
FIG. 3A is a cross-sectional view illustrating a method of fabricating the electronic component.
Figure 3B:
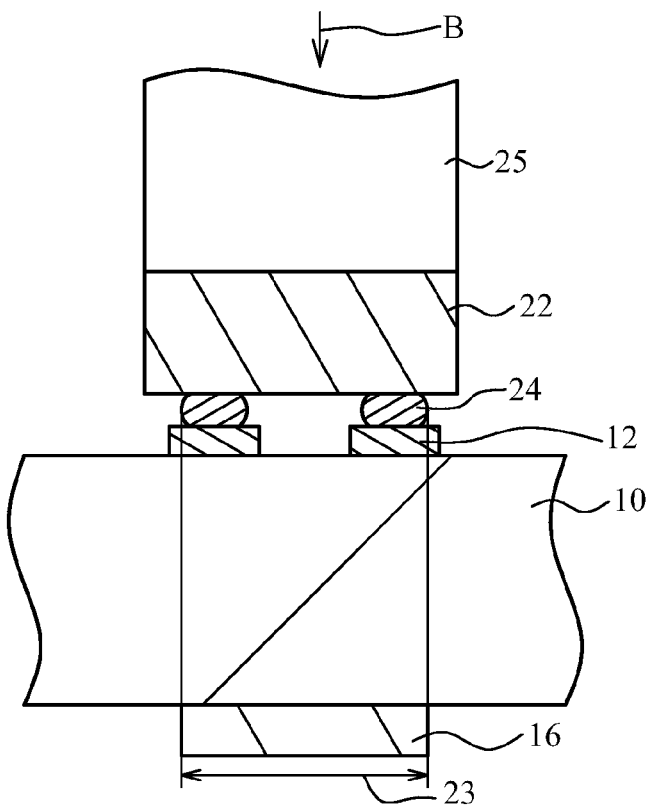
FIG. 3B is an enlarged cross-sectional view of the SAW device.

FIG. 3A is a cross-sectional view illustrating a method of fabricating the electronic component 100. As illustrated in FIG. 3A, the semiconductor device 20 and the SAW devices 22 are sucked by tools 25, and arranged on the substrate 10. While the tools 25 brings downward pressure (pressure toward the substrate 10) on the semiconductor device 20 and the SAW devices 22 as indicated by arrow B, heat is applied. Thermocompression melts solder, and the bumps 24 are bonded to the pads 12. FIG. 3B is an enlarged cross-sectional view of the SAW device 22. As illustrated FIG. 3B, the SAW device 22 is arranged on the substrate 10 so that the whole of the region 23 overlaps with the pad 16, and then flip-chip mounted.

In the first embodiment, the pads 14 and 16 reduce stress applied to the substrate 10 during flip-chip mounting. Therefore, the substrate 10 is prevented from being damaged. As illustrated in FIG. 2B and FIG. 3B, the pad 16 preferably has a width W2 equal to or greater than the width of the region 23. The pad 16 overlaps with the whole of the region 23, i.e. all the bumps 24 bonded to the SAW device 22. This enables to effectively reduce the stress applied to the substrate 10 under the SAW devices 22. As with the pad 16, the pad 14 preferably has a width equal to or greater than the width of a region (not illustrated) surrounded by the bumps 24 in the semiconductor device 20. The substrate 10 does not need to be thickened to be prevented from being damaged, and thus the height of the electronic component 100 can be reduced.

The pad 14 corresponding to the semiconductor device 20 is provided, and the pads 16 corresponding to the SAW devices 22 are provided. Thus, the stress applied to the substrate 10 when the components are flip-chip mounted is reduced, and the substrate 10 is prevented from being damaged. Moreover, suppressed is the warpage of the substrate 10 due to the difference in thermal expansion coefficient between the pads 14 and 16 and the substrate 10. The suppression of the warpage of the substrate 10 improves the reliability of the connection between the bump 24 and the pad 12. For example, as described in a second comparative example, the provision of a large pad overlapping with the SAW devices 22 increases the warpage of the substrate 10. The warpage decreases the reliability of the connection between the bump 24 and the pad 12.

The pads 14 and 16 may be used as a terminal for inputting and outputting a signal or a ground terminal, or may be a dummy pad that does not have an electrical function. Instead of the pads 14 and 16, an insulating layer formed of a resin may be provided. That is to say, provision of an additional film made of a metal or an insulating material on the lower surface of the substrate 10 can prevent the substrate 10 from being damaged.

Figure 4A:
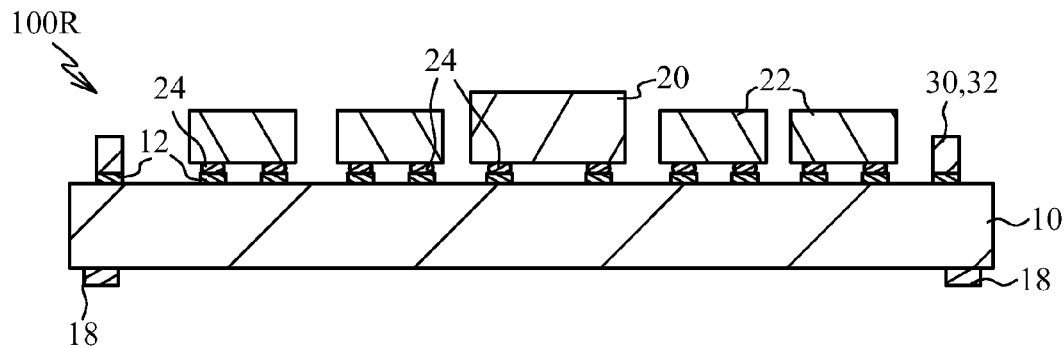
FIG. 4A is a cross-sectional view illustrating an electronic component in accordance with a first comparative example.
Figure 4B:
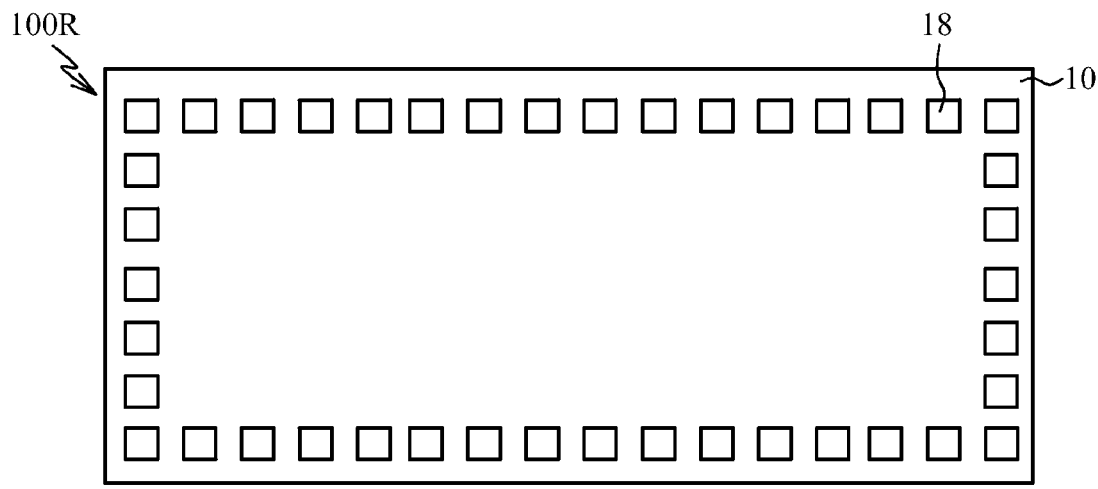
FIG. 4B is a bottom view illustrating the electronic component.
Figure 4C:
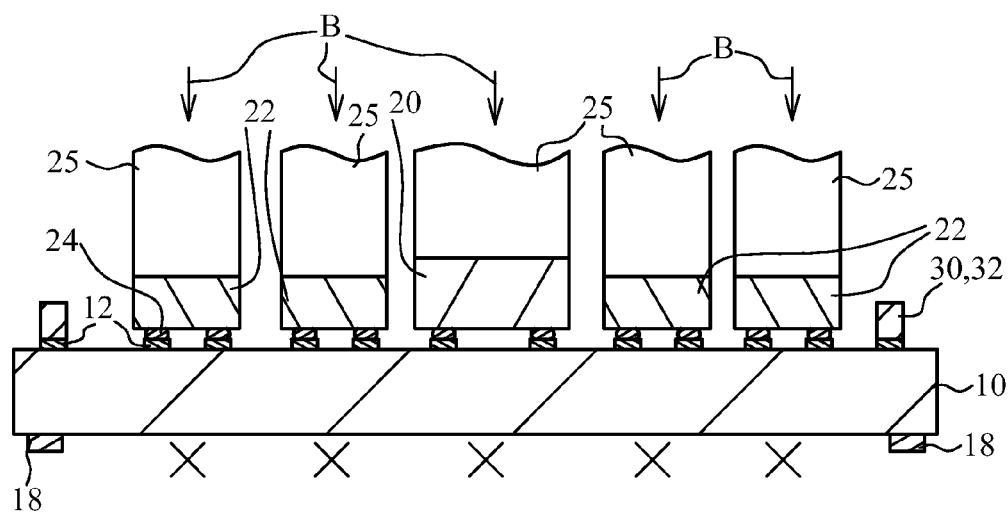
FIG. 4C is a cross-sectional view illustrating a method of fabricating the electronic component.

A description will now be given of comparative examples. FIG. 4A is a cross-sectional view illustrating an electronic component 100R in accordance with a first comparative example. FIG. 4B is a bottom view illustrating the electronic component 100R. As illustrated in FIG. 4A and FIG. 4B, the pads 14 and 16 are not located on the lower surface of the substrate 10. FIG. 4C is a cross-sectional view illustrating a method of fabricating the electronic component 100R. The semiconductor device 20 and the SAW devices 22 are flip-chip mounted on the substrate 10. As indicated by arrow B, downward pressure is applied from the tools 25. The pads 14 and 16 are not located in the locations overlapping with the semiconductor device 20 and the SAW devices 22. Therefore, the stress applied to the substrate 10 is greater than that in the first embodiment. As indicated by cross marks in FIG. 4C, the pressure causes cracks in the substrate 10 or breaks the substrate 10, and thus the substrate 10 is damaged.

Figure 5A:
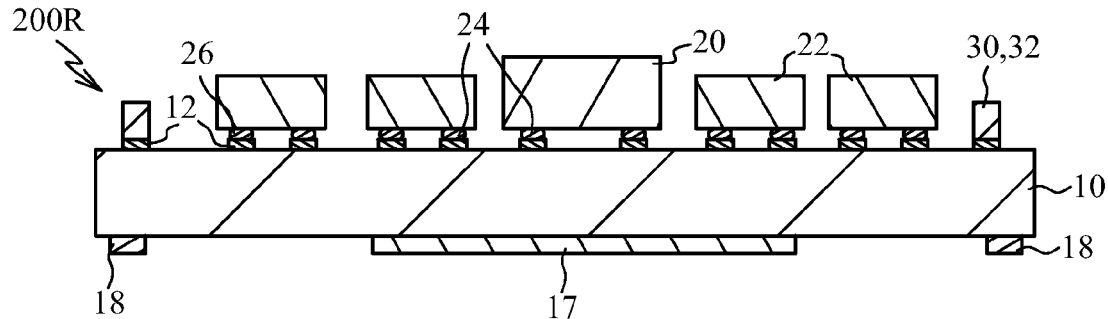
FIG. 5A is a cross-sectional view illustrating an electronic component in accordance with a second comparative example.
Figure 5B:
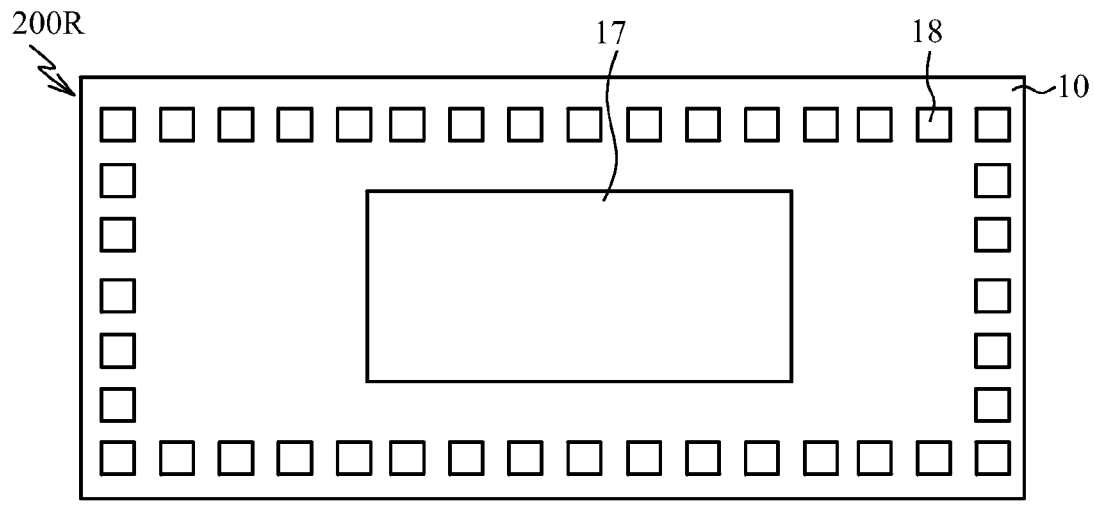
FIG. 5B is a bottom view illustrating the electronic component.
Figure 5C:
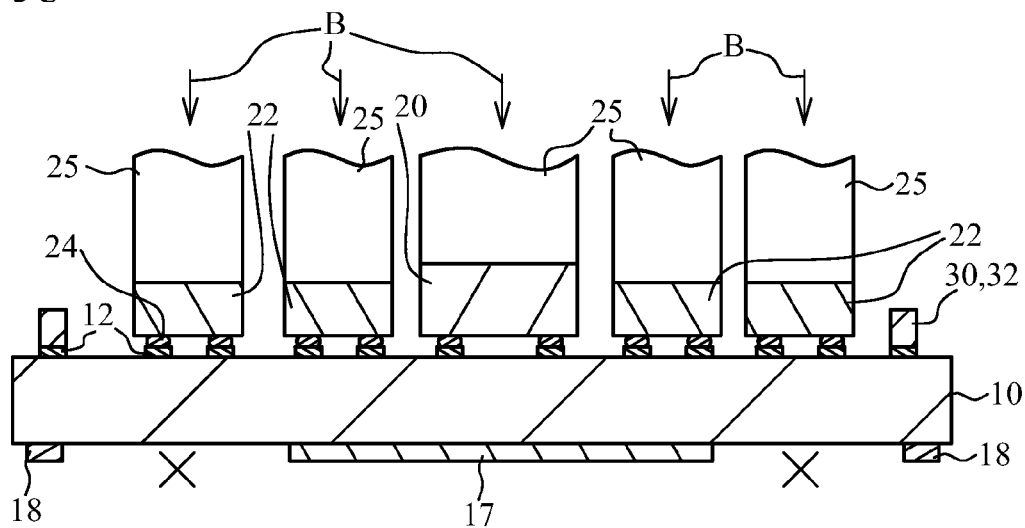
FIG. 5C is a cross-sectional view illustrating a method of fabricating the electronic component.

FIG. 5A is a cross-sectional view illustrating an electronic component 200R in accordance with a second comparative example. FIG. 5B is a bottom view illustrating the electronic component 200R. As illustrated in FIG. 5A and FIG. 5B, a single pad 17 is located on the lower surface of the substrate 10. The pad 17 overlaps with the semiconductor device 20 and two SAW devices 22 locating adjacent to the semiconductor device 20. A pad is not located on the lower surface of the substrate 10 in the locations overlapping with other two SAW devices 22. FIG. 5C is a cross-sectional view illustrating a method of fabricating the electronic component 200R. As indicated by arrow B, downward pressure is applied from the tools 25. The substrate 10 is hardly damaged in the part in which the pad 17 is located. However, the stress applied to the substrate 10 is high in the part in which the pad 17 is not located. Therefore, the substrate 10 is damaged as indicated by cross marks in FIG. 5C. In addition, the pad 17 is large, and therefore temperature change causes the warpage of the substrate 10 due to the difference in thermal expansion coefficient between the substrate 10 and the pad 17. The warpage decreases the reliability of the connection between the bump 24 and the pad 12.

Figure 6A:
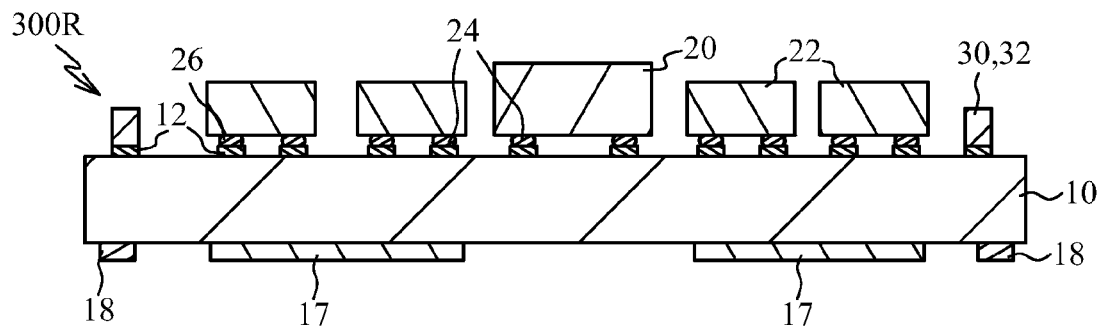
FIG. 6A is a cross-sectional view illustrating an electronic component in accordance with a third comparative example.
Figure 6B:
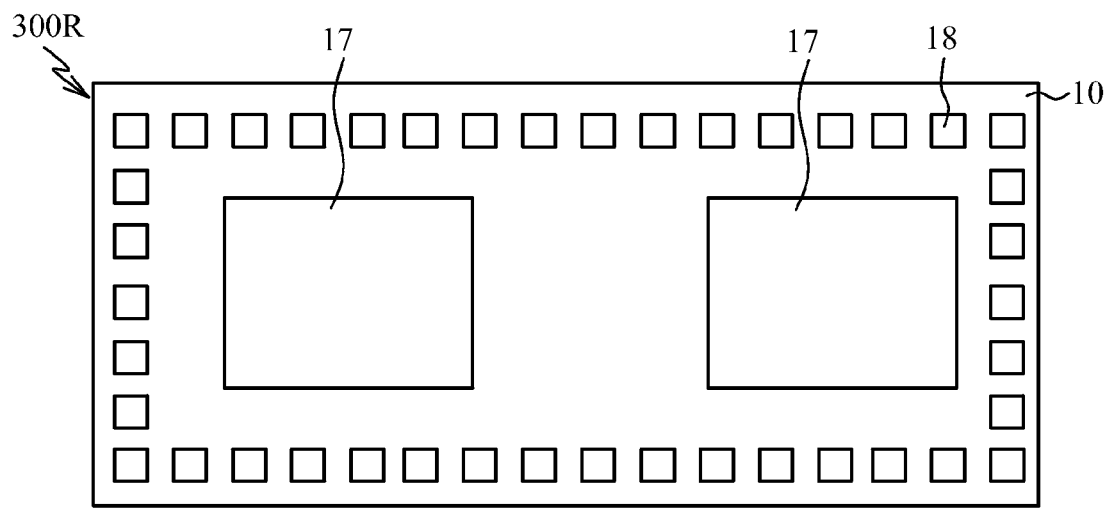
FIG. 6B is a bottom view illustrating the electronic component.
Figure 6C:
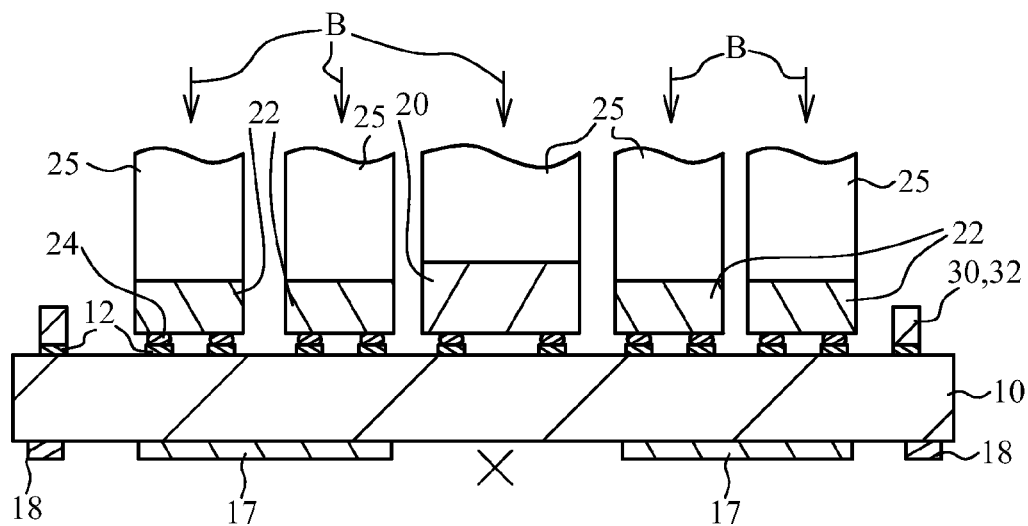
FIG. 6C is a cross-sectional view illustrating a method of fabricating the electronic component.

FIG. 6A is a cross-sectional view illustrating an electronic component 300R in accordance with a third comparative example. FIG. 6B is a bottom view illustrating the electronic component 300R. As illustrated in FIG. 6A and FIG. 6B, two pads 17 are located on the lower surface of the substrate 10. Each of the pads 17 overlaps with two SAW devices 22. A pad is not located on the lower surface of the substrate 10 in the location overlapping with the semiconductor device 20. FIG. 6C is a cross-sectional view illustrating a method of fabricating the electronic component 300R. As indicated by a cross mark in FIG. 6C, the substrate 10 under the semiconductor device 20 is damaged. In addition, the pad 17 is large, and thus the warpage of the substrate 10 is easily caused by temperature change. As the substrate 10 becomes thinner, the substrate 10 is more easily damaged in the first through third comparative examples. Furthermore, the effect of the warpage of the substrate 10 (due to the difference in thermal expansion coefficient between a component mounted on the upper surface and a pad formed on the lower surface) increases. Therefore, in the first through third comparative examples, it is difficult to thin the substrate 10 and thereby reduce the height of the electronic component. Especially, the substrate 10 formed of ceramic is fragile, and easily damaged.

A description will now be given of a simulation of the stress applied to the substrate 10. Calculated is the stress applied to the substrate 10 when the pads 12 and the bumps 24 are not provided and the substrate 10 is placed into directly contact with the SAW device 22. Stresses of five models are compared.

Figure 7:
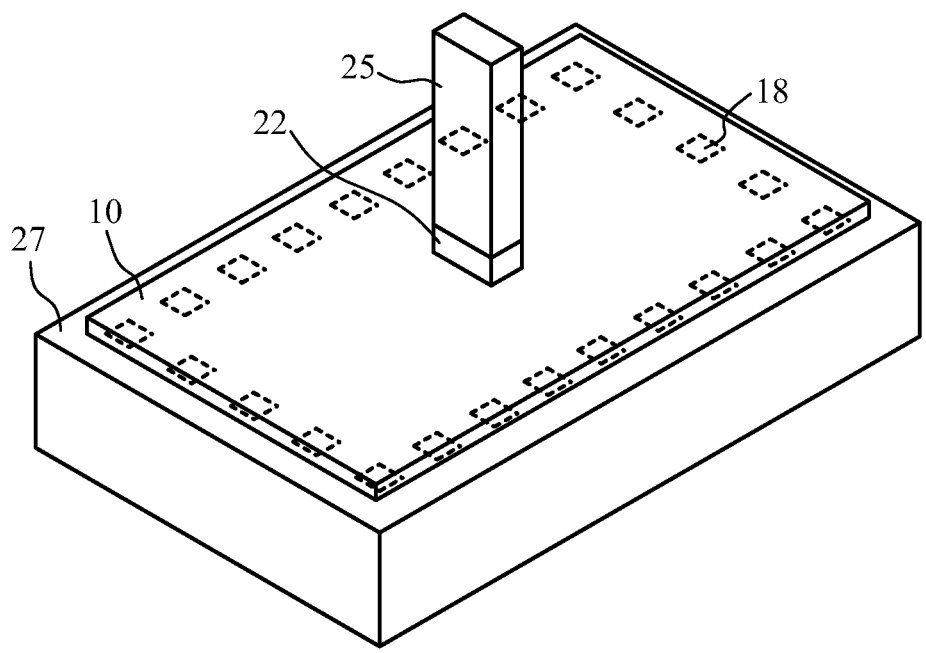
FIG. 7 is a perspective view illustrating an overview of a simulation.

FIG. 7 is a perspective view illustrating an overview of the simulation. As illustrated in FIG. 7, the substrate 10 is located on a base 27. The SAW device 22 is located in the center of the upper surface of the substrate 10, and pressed downward by the tool 25. The tool 25 and the base 27 are made from steel, and the pressure force is 40 N. The pads 18 located on the lower surface of the substrate 10 are illustrated by a dotted line. The pad 18 has a size of 0.5×0.5×0.02 mm$^3$. The substrate 10 is High Temperature Cofired Ceramics (HTCC) with a thickness of 30 μm.

The simulation uses five models. Table 1 presents the sizes of the SAW device 22 and the pad 16 used in the simulation, whether the SAW device 22 and the pad 16 overlap with each other, and calculation results of the maximum value of stress.

TABLE 1

| | SIZE OF SAW DEVICE 22 [mm$^3$] | SIZE OF PAD 16 [mm$^3$] | WHETHER TO OVERLAP | MAXIMUM VALUE OF STRESS [Pa] |
|---|---|---|---|---|
| MODEL A | 0.64 × 1.17 × 0.02 | — | NOT OVERLAP | 4.1 × 10$^8$ |
| MODEL B | 0.64 × 1.17 × 0.02 | 0.64 × 1.17 × 0.02 | PARTLY OVERLAP | 8.6 × 10$^7$ |
| MODEL C | 0.64 × 1.17 × 0.02 | 0.64 × 1.17 × 0.02 | NOT OVERLAP | 3.7 × 10$^8$ |
| MODEL D | 0.64 × 1.17 × 0.02 | 0.32 × 1.17 × 0.02 | PARTLY OVERLAP | 5.7 × 10$^7$ |
| MODEL E | 0.64 × 1.17 × 0.02 | 0.64 × 1.17 × 0.02 | ENTIRELY OVERLAP | 2.8 × 10$^7$ |

As presented in Table 1, the pad 16 is not provided in model A. In models B, C and E, the pad 16 with the same size as the SAW device 22 is provided. The pad 16 in model D is smaller than the SAW device 22. With reference to cross-sectional views and bottom views, a description will now be given of a detailed structure and stress of each mode.

Figure 8A:
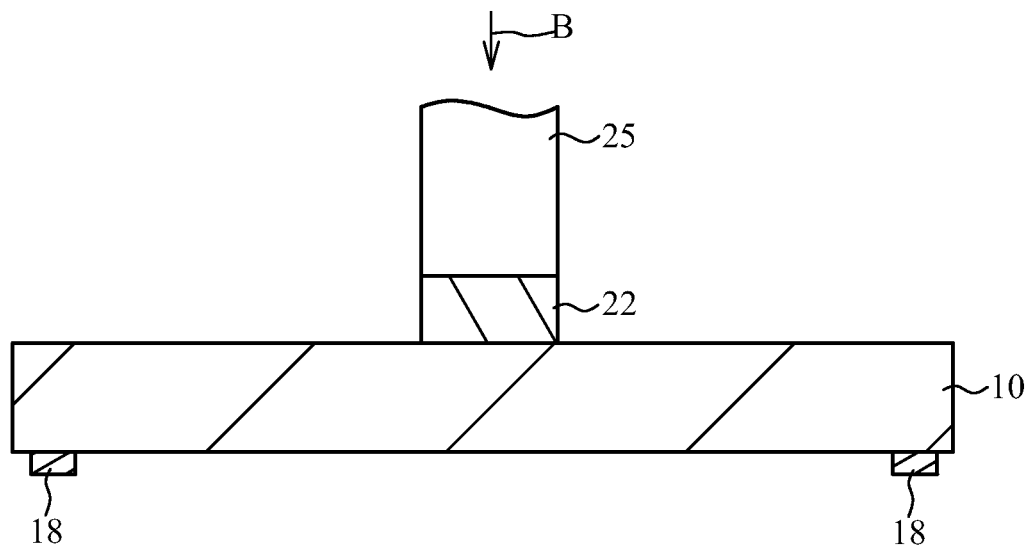
FIG. 8A is a cross-sectional view illustrating model A.
Figure 8B:
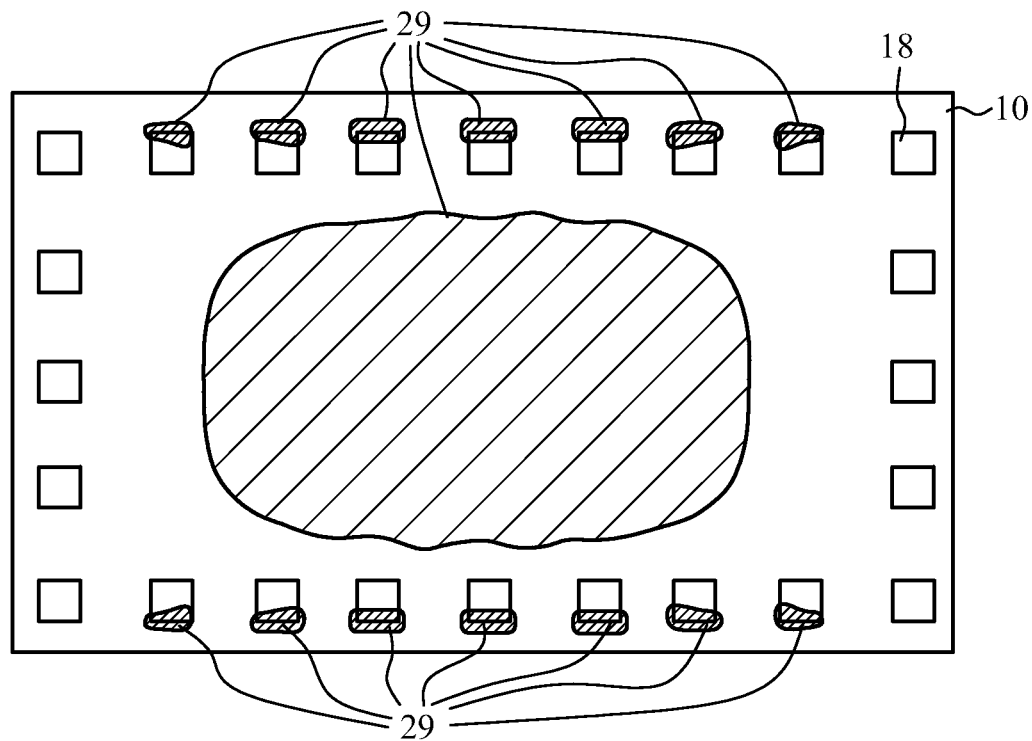
FIG. 8B is a bottom view illustrating stress distribution in model A.

FIG. 8A is a cross-sectional view illustrating model A. FIG. 8B is a bottom view illustrating stress distribution in model A. Regions 29 indicated by hatching in FIG. 8B are regions in which the stress is 5.0×10$^7$ Pa or greater. As illustrated in FIG. 8A, the pad 16 is not located, and thus the pad 16 and the SAW device 22 do not overlap with each other as presented in Table 1. As illustrated in FIG. 8B, the regions 29 are formed in the center of the substrate 10 and near some of the pads 18. As presented in Table 1, the maximum value of the stress is 4.1×10$^8$ Pa.

Figure 9A:
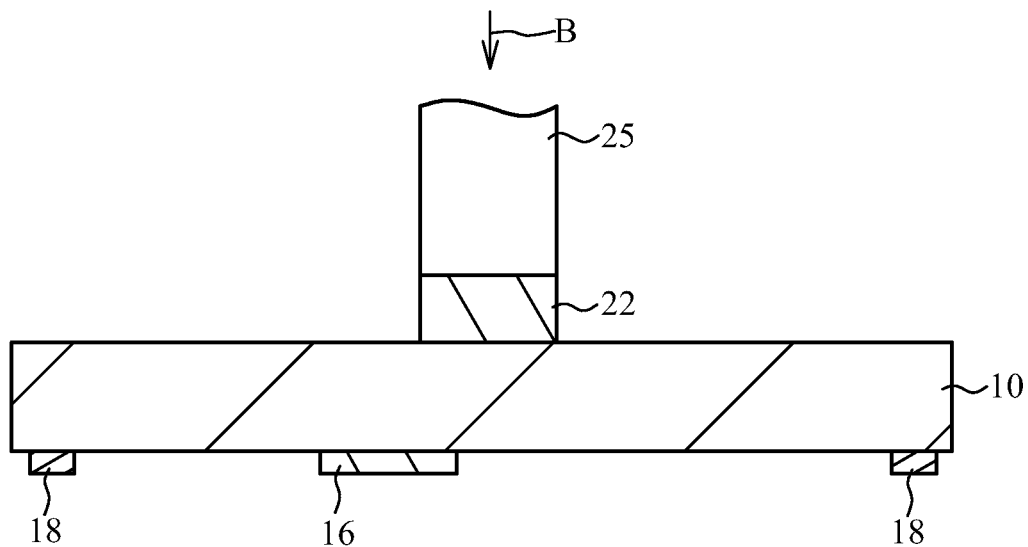
FIG. 9A is a cross-sectional view illustrating model B.
Figure 9B:
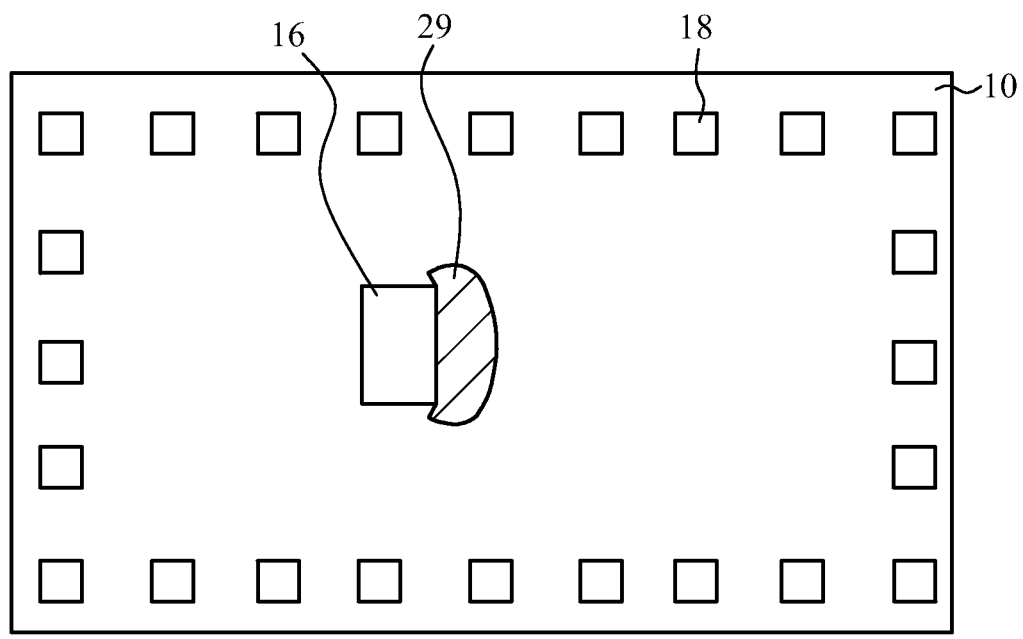
FIG. 9B is a bottom view illustrating stress distribution in model B.

FIG. 9A is a cross-sectional view illustrating model B. FIG. 9B is a bottom view illustrating stress distribution in model B. As illustrated in FIG. 9A, the pad 16 is located 0.32 mm aside from the SAW device 22 toward the left in FIG. 9A. Therefore, as presented in Table 1, the pad 16 does not overlap with the whole of the SAW device 22 but overlaps with a part thereof. At the right side of the pad 16 in FIG. 9B, the SAW device 22 does not overlap with the pad 16 and the stress is high. As presented in Table 1, the maximum value of the stress is 8.6×10$^7$ Pa.

Figure 10A:
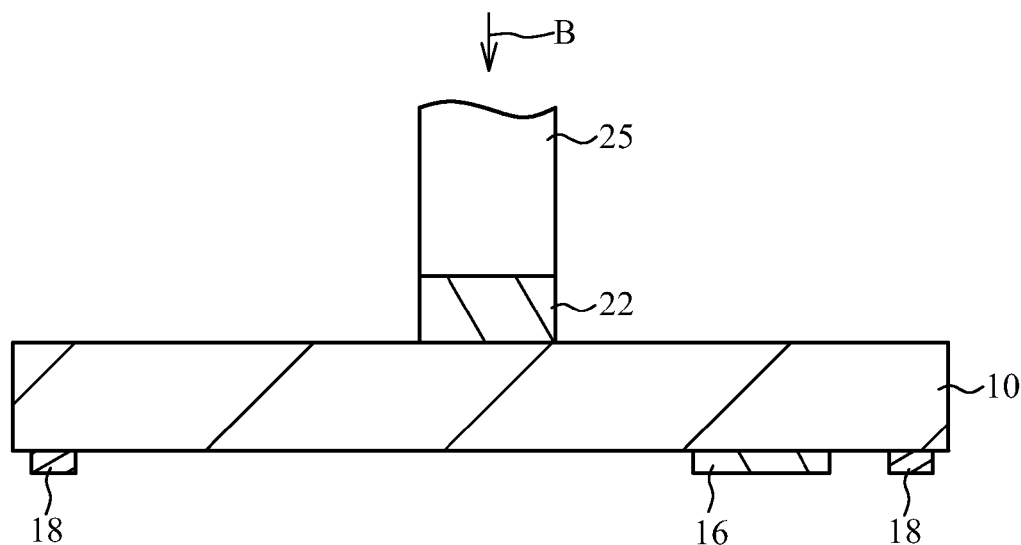
FIG. 10A is a cross-sectional view illustrating model C.
Figure 10B:
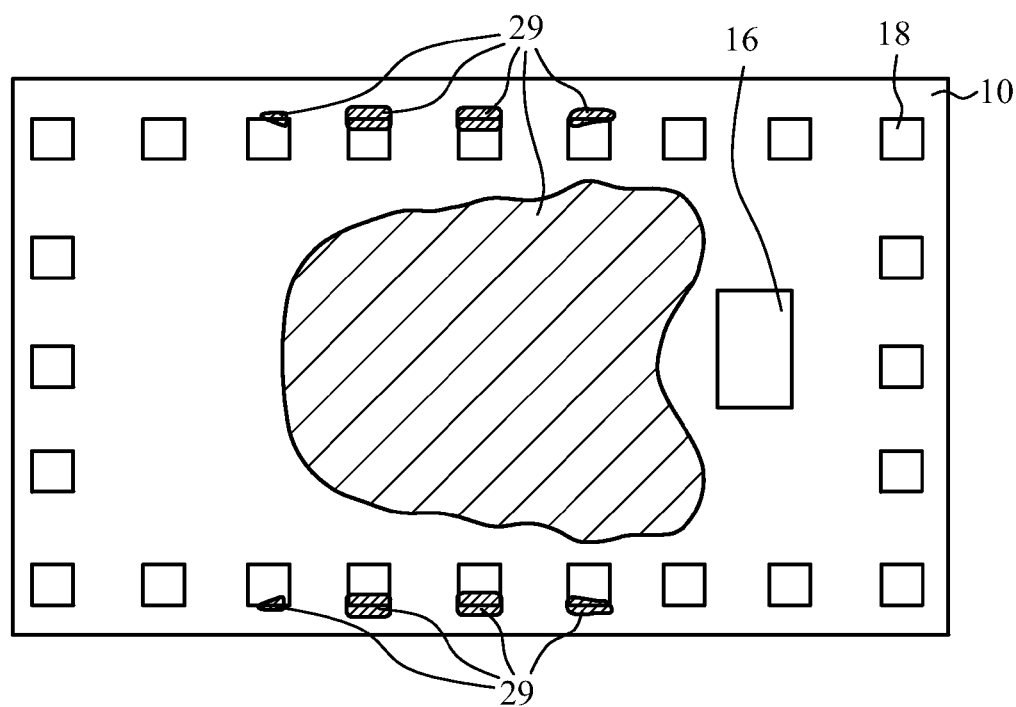
FIG. 10B is a bottom view illustrating stress distribution in model C.

FIG. 10A is a cross-sectional view illustrating model C. FIG. 10B is a bottom view illustrating stress distribution in model C. As presented in FIG. 10A and Table 1, the pad 16 does not overlap with the SAW device 22. As illustrated in FIG. 10B, the region 29 is formed in the center of the substrate 10. In addition, the regions 29 appear near some of the pads 18. As presented in Table 1, the maximum value of the stress is 3.7×10$^8$ Pa.

Figure 11A:
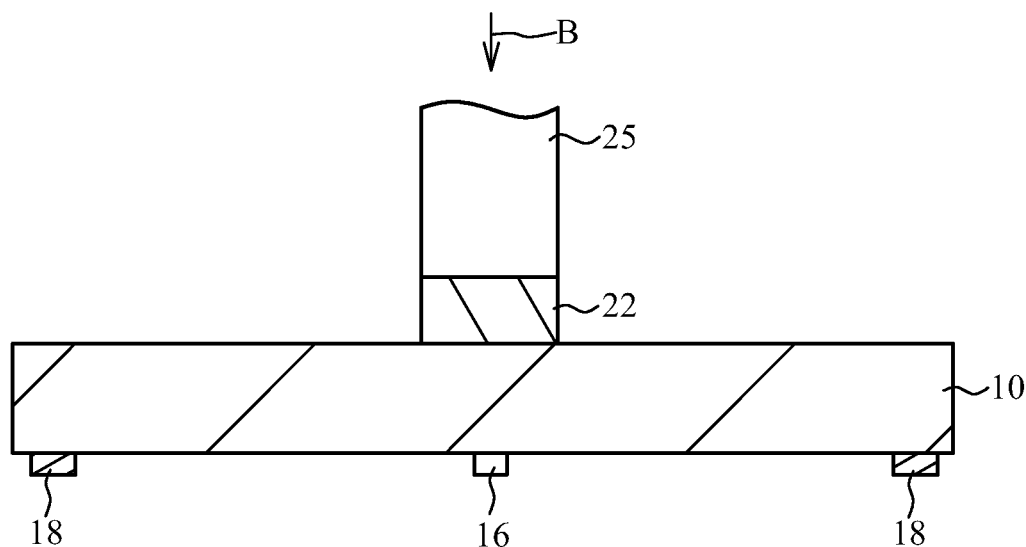
FIG. 11A is a cross-sectional view illustrating model D.
Figure 11B:
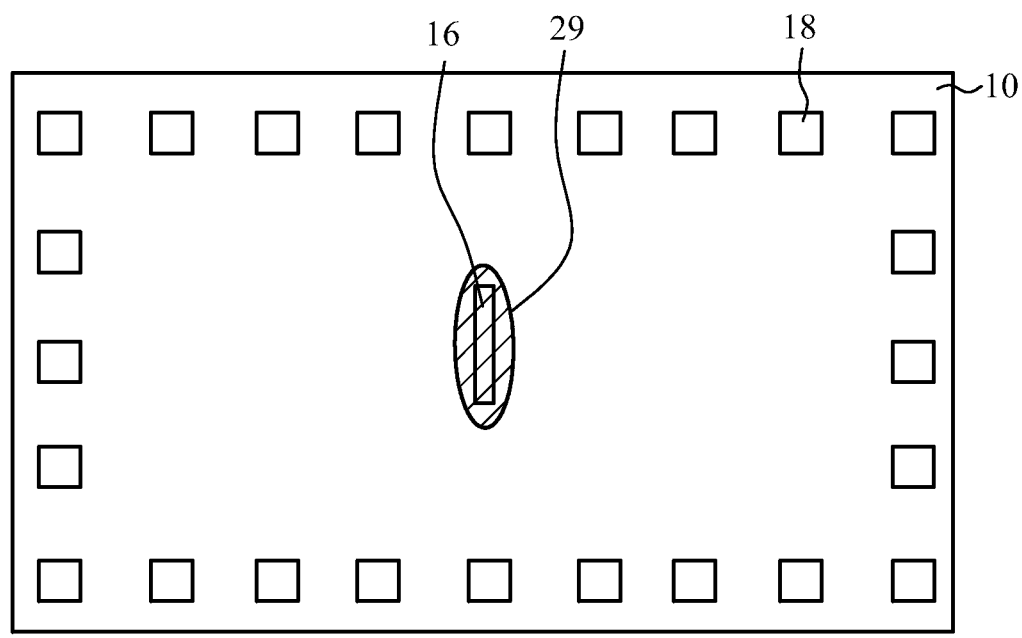
FIG. 11B is a bottom view illustrating stress distribution in model D.

FIG. 11A is a cross-sectional view illustrating model D. FIG. 11B is a bottom view illustrating stress distribution in model D. As illustrated in FIG. 11A, the pad 16 is smaller than the SAW device 22, and thus overlaps with a part of the SAW device 22 but does not overlap with the whole of the SAW device 22 as presented in Table 1. As illustrated in FIG. 11B, the region 29 including the pad 16 is formed. As presented in Table 1, the maximum value of the stress is 5.7×10$^7$ Pa.

Figure 12A:
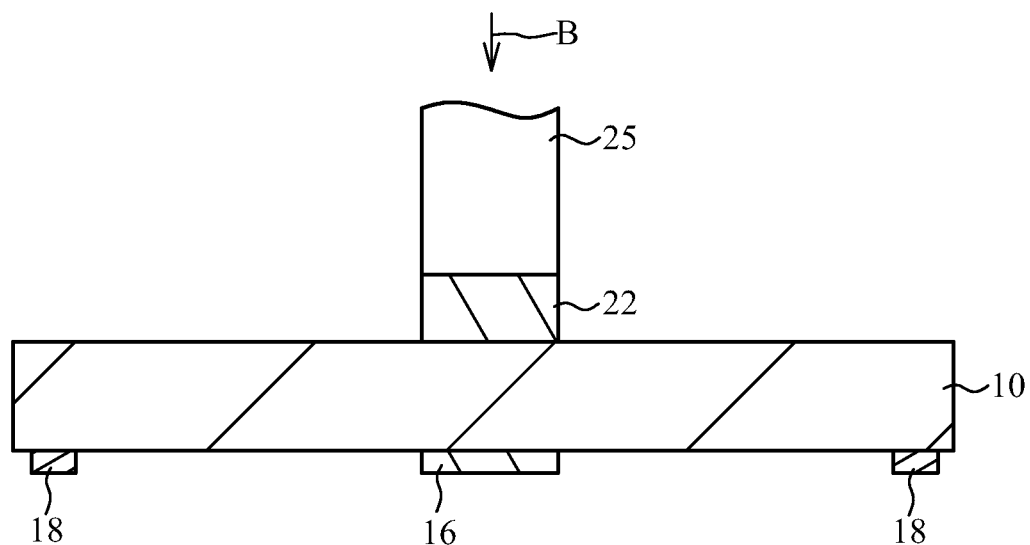
FIG. 12A is a cross-sectional view illustrating model E.
Figure 12B:
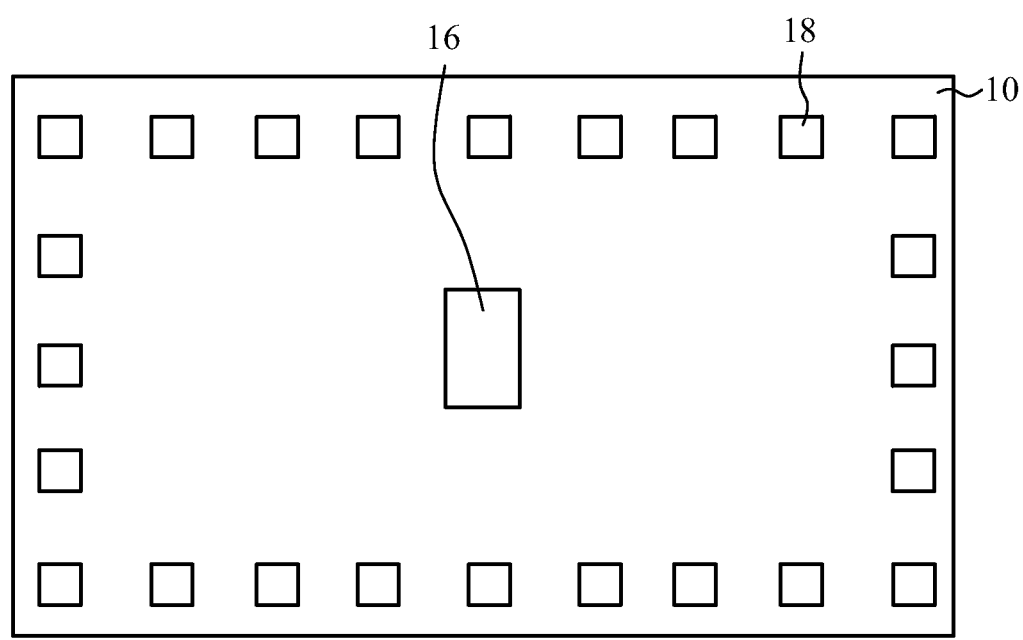
FIG. 12B is a bottom view illustrating stress distribution in model E.

FIG. 12A is a cross-sectional view illustrating model E. FIG. 12B is a bottom view illustrating stress distribution in model E. As presented in FIG. 12A and Table 1, the pad 16 overlaps with the whole of the SAW device 22. As illustrated in FIG. 12B, the region 29 is not formed. As presented in Table 1, the maximum value of the stress is $2.8 \times 10^7$ Pa.

The above-described simulation reveals that the stress can be reduced by providing the pad immediately below a part pressed by the tool 25. When the bumps 24 are used for flip-chip mounting, the stress can be reduced by making the pad 16 overlap with the region 23 surrounded by the bumps 24 as described in the first embodiment.

Second Embodiment

Figure 13A:
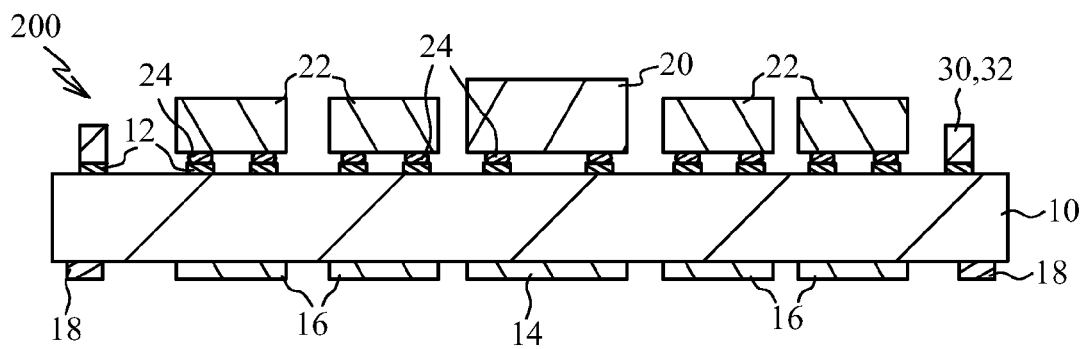
FIG. 13A is a cross-sectional view illustrating an electronic component in accordance with a second embodiment.
Figure 13B:
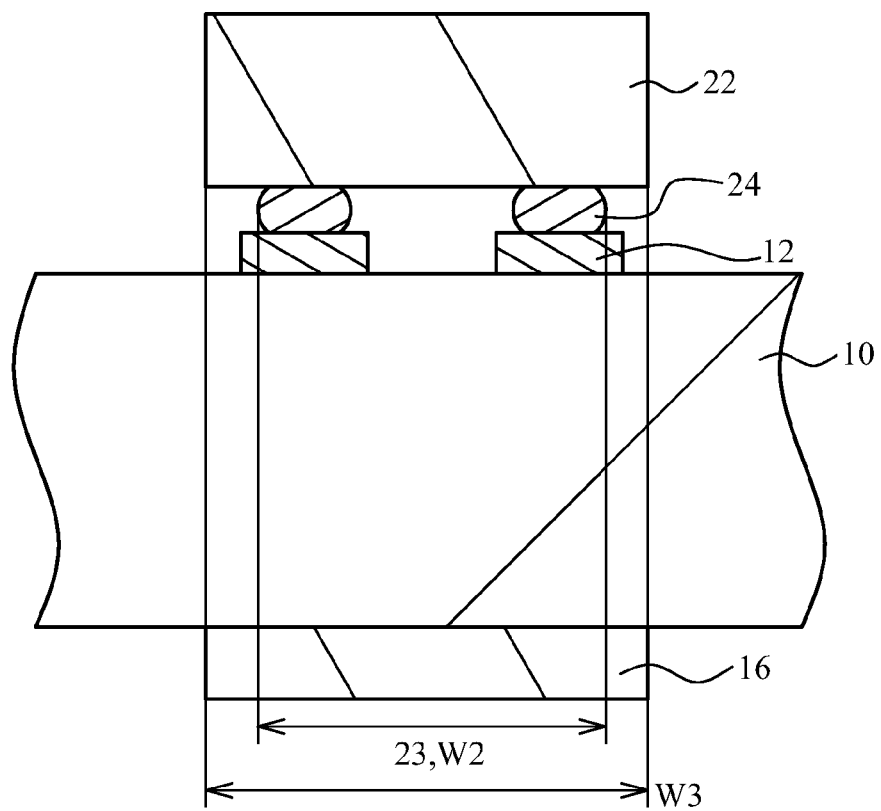
FIG. 13B is an enlarged cross-sectional view of a SAW device.

A second embodiment described a case where the pads 14 and 16 are enlarged. FIG. 13A is a cross-sectional view illustrating an electronic component 200 in accordance with a second embodiment. FIG. 13B is an enlarged cross-sectional view of the SAW device 22.

As illustrated in FIG. 13A, the widths of the pads 14 and 16 in the second embodiment are greater than those in the first embodiment. As illustrated in FIG. 13B, the pad 16 is wider than the region 23, and has a width W3 equal to, for example, that of the SAW device 22. The pad 14 has a width equal to, for example, that of the semiconductor device 20. The bump 24 is formed of Au.

Figure 14A:
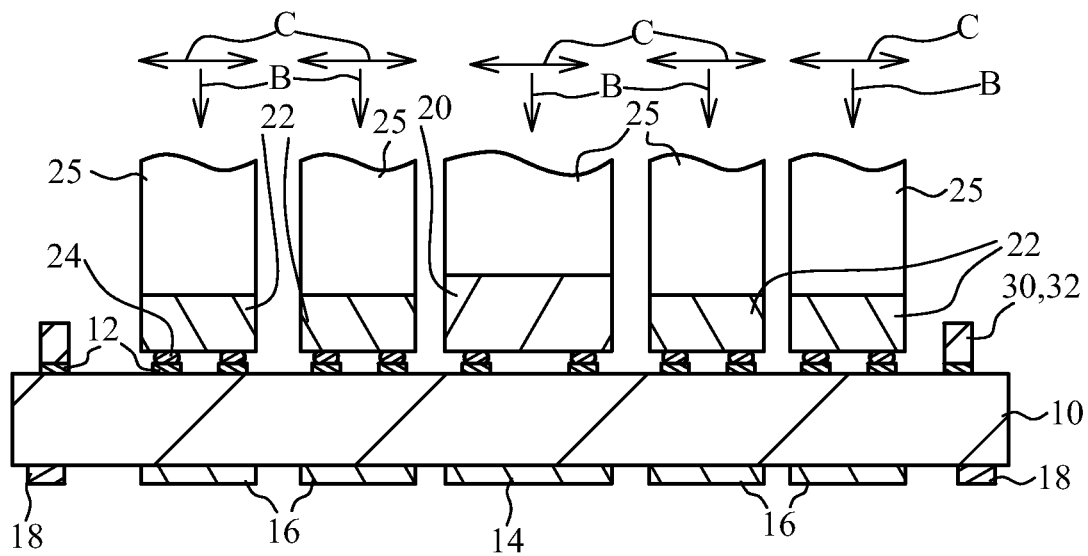
FIG. 14A is a cross-sectional view illustrating a method of fabricating the electronic component.
Figure 14B:
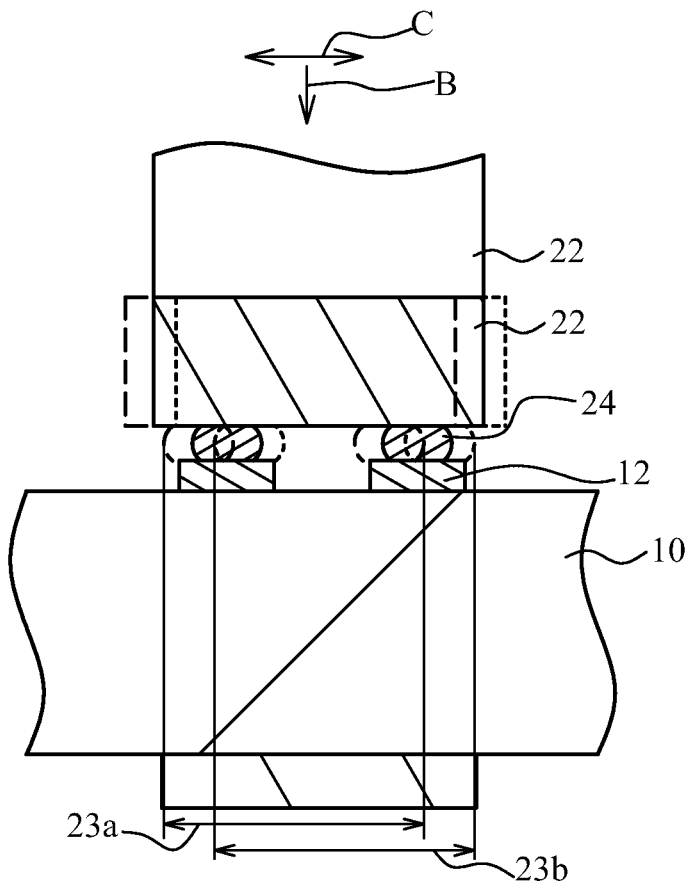
FIG. 14B is an enlarged cross-sectional view of the SAW device.

FIG. 14A is a cross-sectional view illustrating a method of fabricating the electronic component 200. As illustrated in FIG. 14A, ultrasonic waves are applied to the semiconductor device 20 and the SAW devices 22 with the tools 25 to vibrate them in the lateral direction as indicated by arrow C. While vibrating the semiconductor device 20 and the SAW devices 22, downward pressure (pressure toward the substrate 10) indicated by arrow B is applied and heat is also applied. This process bonds the bumps 24 to the pads 12, both made of Au. The amount of displacement of the semiconductor device 20 and the SAW device 22 in the lateral direction by ultrasonic waves is, for example, a few micrometers. FIG. 14B is an enlarged cross-sectional view of the SAW device 22. A dashed line in FIG. 14B indicates the SAW device 22 displaced to the left by the ultrasonic wave. The region surrounded by the bumps 24 of the SAW device 22 at this time is referred to as a region 23a. A dotted line indicates the SAW device 22 displaced to the right by the ultrasonic wave. The region surrounded by the bumps 24 of the SAW device 22 at this time is referred to as a region 23b. The width of the pad 16 is wide, and thus the pad 16 overlaps with the regions 23a and 23b even when the SAW device 22 is displaced. Therefore, the stress applied to the substrate 10 is reduced in flip-chip mounting using ultrasonic waves.

To reduce the stress, it is sufficient if the width of the pad 16 is greater than that of the region 23, and the width of the pad 14 is greater than the width of the region surrounded by the bumps 24 of the semiconductor device 20. However, as the pads 14 and 16 becomes larger, the warpage of the substrate 10 increases. To suppress the warpage, the width of the pad 16 is made to be equal to or less than that of the SAW device 22 and the width of the pad 14 is made to be equal to or less than that of the semiconductor device 20, for example. The widths of the pads 14 and 16 may be changed depending on the thermal expansion coefficients of the substrate 10 and the pads 14 and 16, and the width of the pad 16 may be made to be equal to or greater than that of the SAW device 22 and the width of the pad 14 may be equal to or greater than that of the semiconductor device 20.

A description will now be given of a simulation. In the structure illustrated in FIG. 7, the SAW device 22 is pressed and vibrated in the lateral direction by ultrasonic waves. Two models having different sizes of the pad 16 are used. Table 2 presents the sizes of the SAW device 22 and the pad 16 used in the simulation, whether the SAW device 22 and the pad 16 overlap with each other, and calculation results of the maximum value of the stress.

TABLE 2

| | SIZE OF SAW DEVICE 22 [mm³] | SIZE OF PAD 16 [mm³] | WHETHER TO OVERLAP | MAXIMUM VALUE OF STRESS [Pa] |
|---|---|---|---|---|
| MODEL F | 0.64 × 1.17 × 0.02 | 0.64 × 1.17 × 0.02 | PARTLY OVERLAP | $5.2 \times 10^7$ |
| MODEL G | 0.64 × 1.17 × 0.02 | 0.74 × 1.17 × 0.02 | ENTIRELY OVERLAP | $4.2 \times 10^7$ |

As presented in Table 2, the pad 16 in model F has the same size as the SAW device 22. The pad 16 in model G is 50 μm larger than the pad 16 in model F to the right and left sides, i.e. 100 μm larger in total.

Figure 15A:
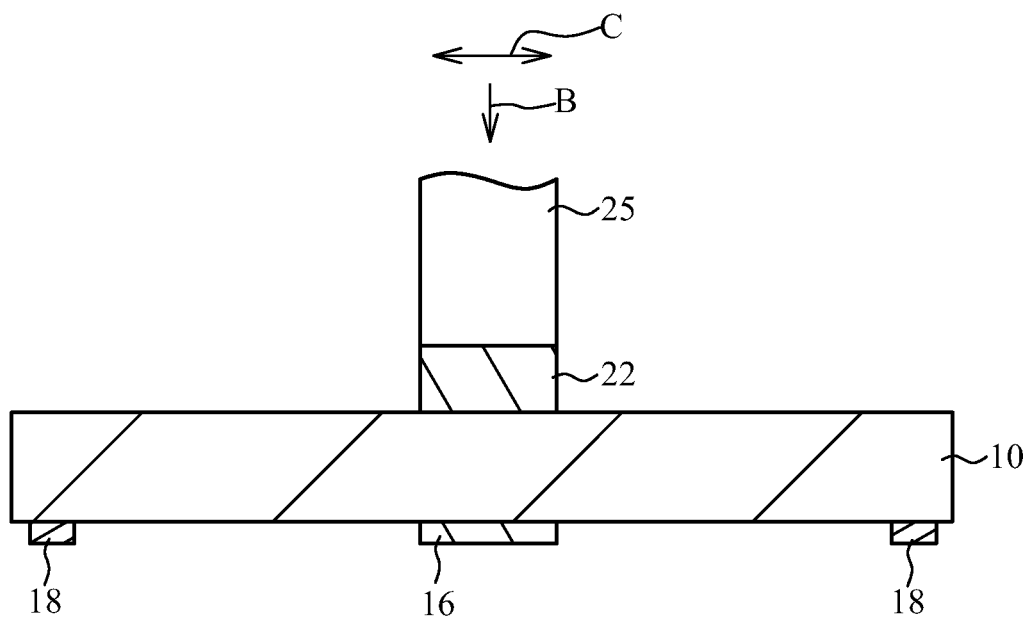
FIG. 15A is a cross-sectional view illustrating model F.
Figure 15B:
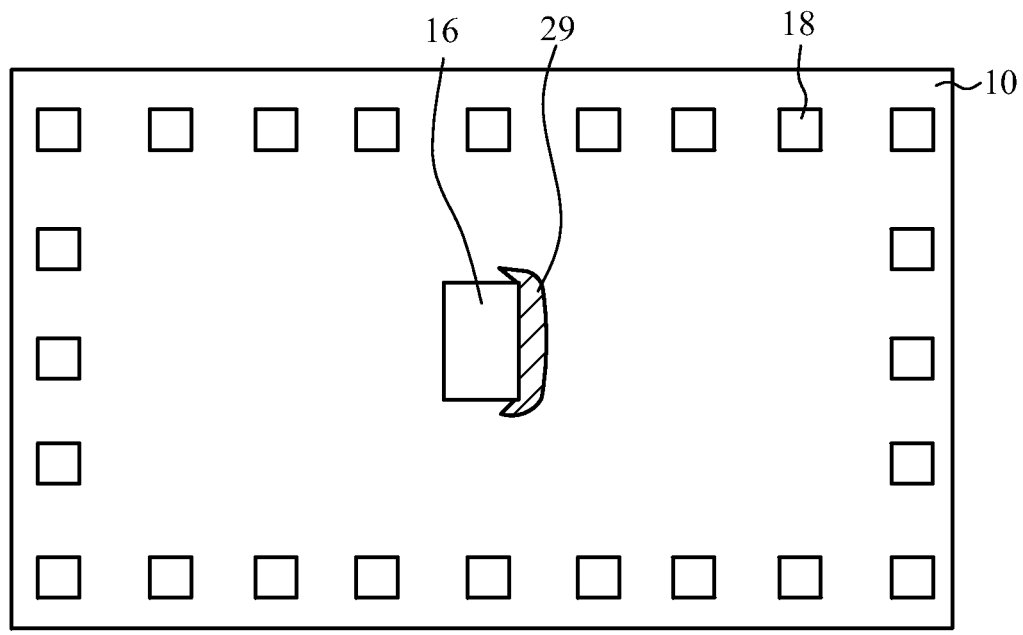
FIG. 15B is a bottom view illustrating stress distribution in model F, and illustrates a case in which the SAW device is displaced to the right.

FIG. 15A is a cross-sectional view illustrating model F. FIG. 15B is a bottom view illustrating stress distribution in model F, and illustrates a case where the SAW device 22 is displaced to the right. As with FIG. 8B, the region in which the stress is $5.0 \times 10^7$ Pa or greater is referred to as the region 29, and indicated by hatching in FIG. 15B. As illustrated in FIG. 15A, the pad 16 overlaps with the SAW device 22. However, when the SAW device 22 vibrates, a part of the SAW device 22 is displaced from the pad 16 in the horizontal direction. Thus, as presented in Table 2, the pad 16 overlaps with a part of the SAW device 22 but does not overlap with the whole of it. As the SAW device 22 protrudes from the right edge of the pad 16, the stress applied to the substrate 10 increases at the right side of the pad 16. As a result, the region 29 is formed at the right side of the pad 16 as illustrated in FIG. 15B. As presented in Table 2, the maximum value of the stress is $5.2 \times 10^7$ Pa.

Figure 16A:
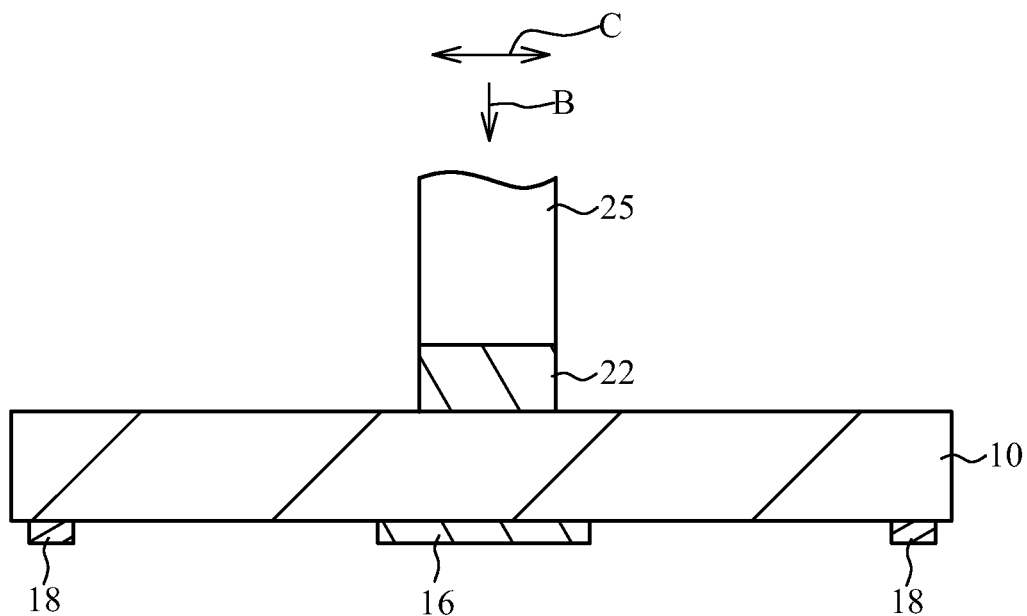
FIG. 16A is a cross-sectional view illustrating model G.
Figure 16B:
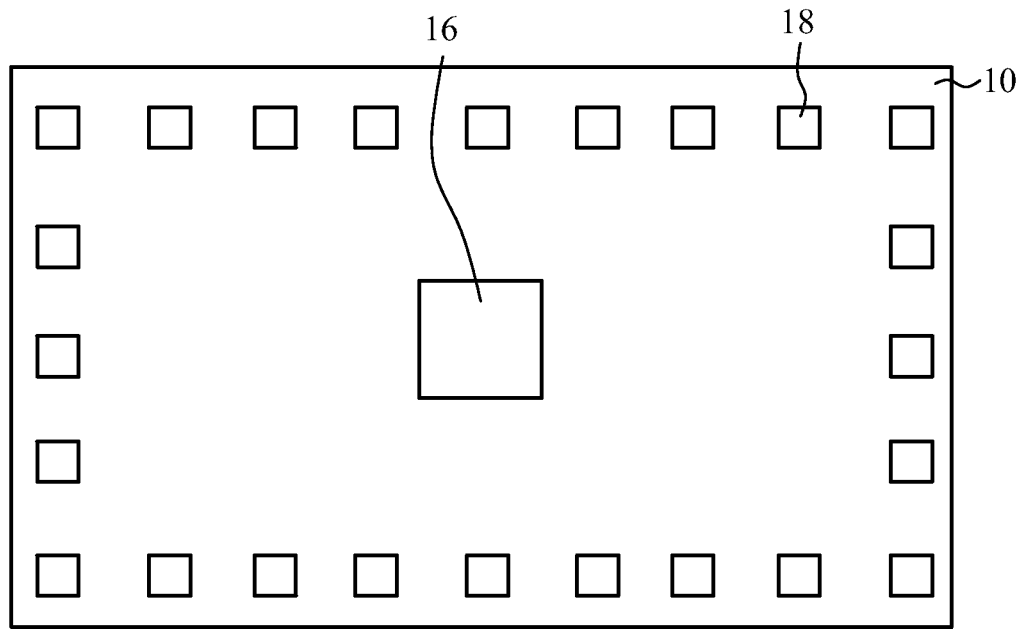
FIG. 16B is a bottom view illustrating stress distribution in model G, and illustrates a case in which the SAW device is displaced to the right.

FIG. 16A is a cross-sectional view illustrating model G. FIG. 16B is a bottom view illustrating stress distribution in model G, and illustrates a case in which the SAW device 22 is displaced to the right. The width of the pad 16 is wide, and thus the pad 16 overlaps with the SAW device 22 even when the SAW device 22 vibrates as presented in Table 2. Thus, the region 29 is not formed as illustrated in FIG. 16B. As presented in Table 2, the maximum value of the stress is $4.2 \times 10^7$ Pa. The above-described simulation reveals that the stress can be reduced, even when the semiconductor device 20 and the SAW device 22 vibrate, by making the widths of the pads 14 and 16 wide. Although the illustration is omitted, the pads 14 and 16 may be made to be large in the direction vertical to the vibration direction, i.e. the depth direction. The stress in the depth direction can be reduced.

Third Embodiment

Figure 17:
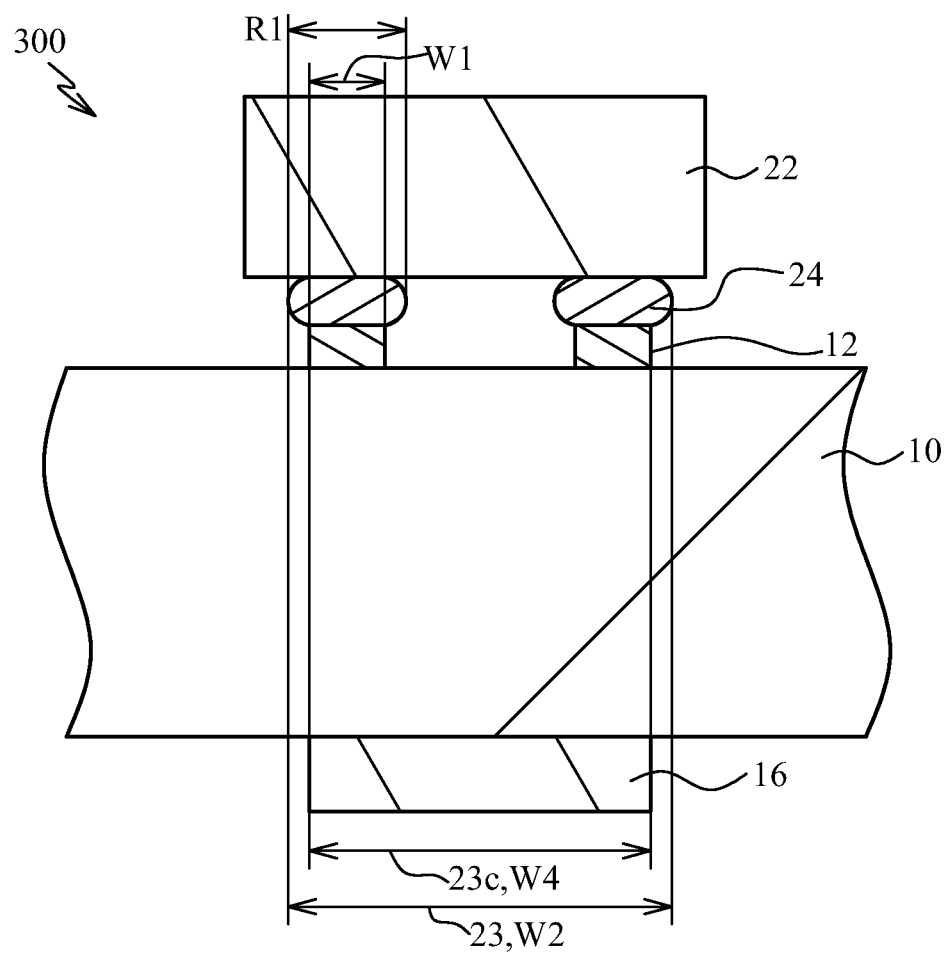
FIG. 17 is an enlarged cross-sectional view of a SAW device of an electronic component in accordance with a third embodiment.

FIG. 17 is an enlarged cross-sectional view of the SAW device 22 of an electronic component 300 in accordance with a third embodiment. Although the illustration is omitted, the electronic component 300 includes the semiconductor device 20 as with the electronic components 100 and 200. As illustrated in FIG. 17, the pad 12 has a width W1 less than the diameter R1 of the bump 24. Thus, a region 23c surrounded by the pads 12 has a width W4 less than the width W2 of the region 23 surrounded by the bumps 24. The pad 16 has a width W4 equal to, for example, that of the region 23c. The overlap between the pad 16 and the region 23c enables to reduce the stress. Although the illustration is omitted, it is sufficient if the pad 14 overlaps with the region surrounded by the pads 12 of the semiconductor device 20. The bump 24 is formed of solder composed mostly of Sn—Ag, and flip-chip mounted without using ultrasonic waves.

Even when the bumps 24 are formed of solder as described in the first and third embodiments, the semiconductor device 20 and the SAW device 22 may be flip-chip mounted by vibrating them by ultrasonic waves as described in the second embodiment. The stress can be reduced by making the widths of the pads 14 and 16 wide. As described in the first through third embodiments, it is sufficient if the pads 14 and 16 overlap with a smaller one of the pad 12 and the bump 24 in all the pad 12/bump 24 pairs. For example, when the SAW device 22 is bonded to the single pad 12 by the single bump 24, it is sufficient if the pad 16 overlaps with a smaller one of the pad 12 and the bump 24.

Fourth Embodiment

Figure 18A:
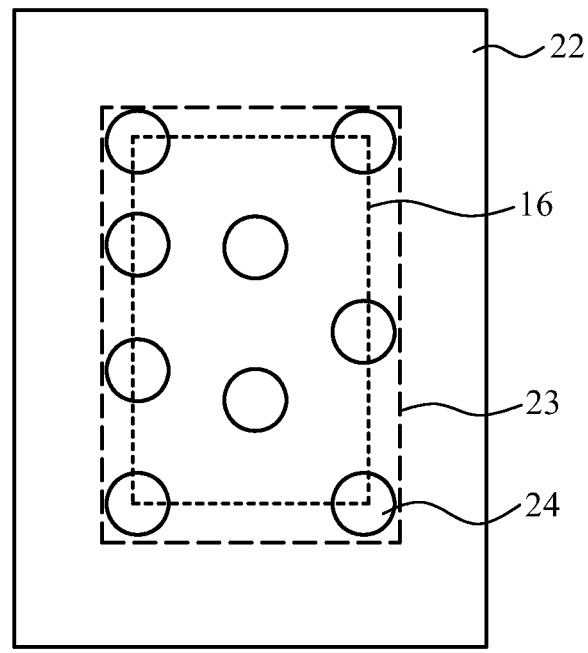
FIG. 18A is a diagram illustrating a lower surface of a SAW device in a fourth embodiment.
Figure 18B:
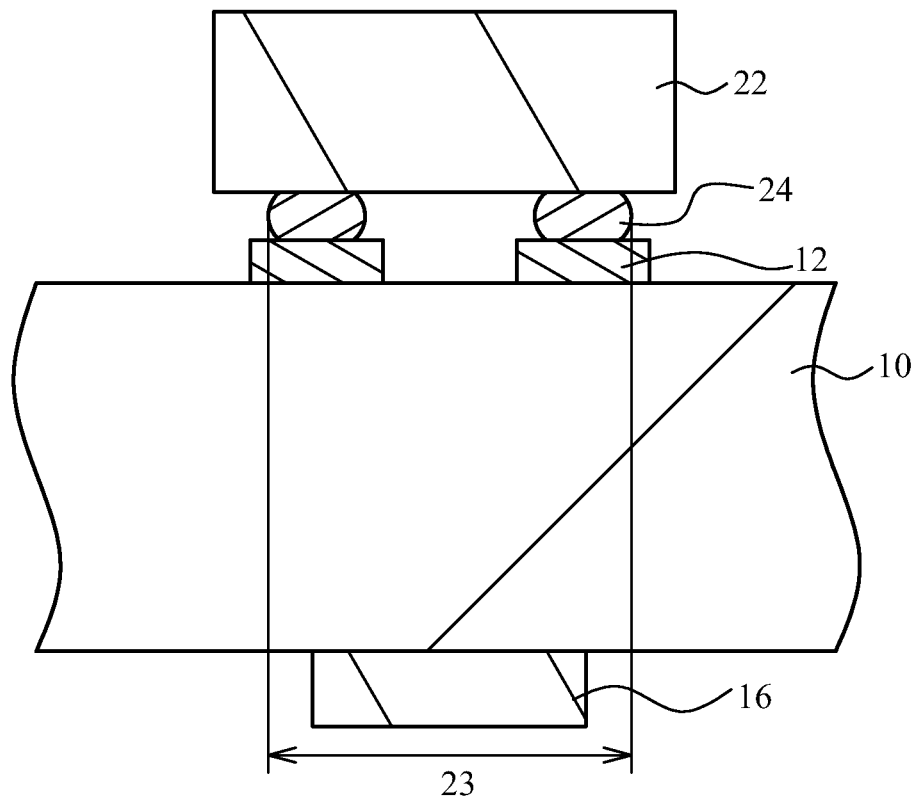
FIG. 18B is a cross-sectional view illustrating the SAW device.

A fourth embodiment describes a case in which the pad 16 overlaps with at least a part of the pad 12 and the bump 24. FIG. 18A is a diagram illustrating the lower surface of the SAW device 22 of the fourth embodiment. A dotted line in FIG. 18A indicates the pad 16 located on the lower surface of the substrate 10. FIG. 18B is a cross-sectional view illustrating the SAW device 22. As illustrated in FIG. 18A and FIG. 18B, the pad 16 is smaller than the region 23, and overlaps with a part of or the whole of the single bump 24.

Figure 19A:
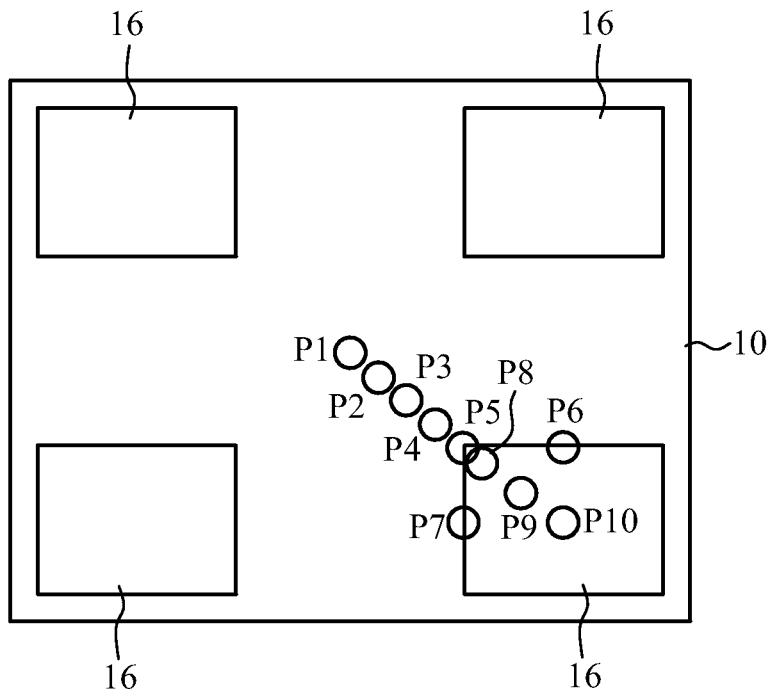
FIG. 19A is a plan view illustrating pressed locations in an experiment.

Even when the pad 16 overlaps with at least a part of the bump 24, the stress can be reduced. Multiple locations in the substrate 10 were pressed, and the maximum stresses generated at the locations were measured. FIG. 19A is a plan view illustrating the pressed locations in the experiment. P1~P10 illustrated in FIG. 19A are pressed with a force of 10 N. P1~P4 do not overlap with the pad 16. A part of each of P5~P7 overlaps with the pad 16. The whole of each of P8~P10 overlaps with the pad 16.

Figure 19B:
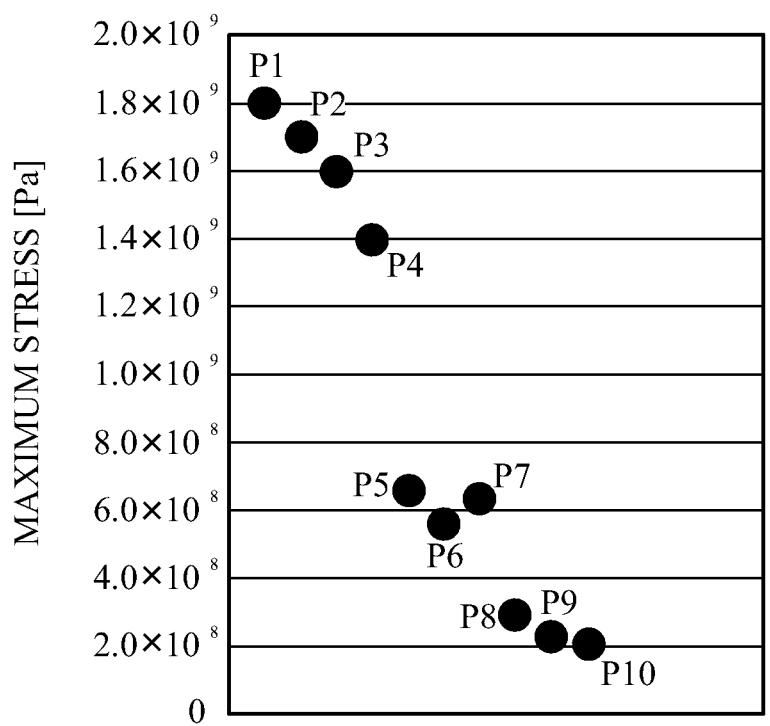
FIG. 19B is a diagram illustrating a maximum stress.

FIG. 19B is a diagram presenting the maximum stress. The horizontal axis represents pressed locations, and the vertical axis represents the maximum stress. As illustrated in FIG. 19B, the maximum stresses at P1~P4 are $1.4~1.8 \times 10^8$ Pa. As the pressed location is closer to the pad 16, the stress decreases. The maximum stresses at P5~P7 are $5.6~6.6 \times 10^8$ Pa, and less than the maximum stresses at P1~P4. When a part of the pressed location overlaps with the pad 16, the maximum stress decreases to a half of or more than a half of the maximum stress generated when the pressed location does not overlap with the pad 16. The maximum stresses at P8~P10 are $2.1~2.9 \times 10^8$ Pa, and are less than the maximum stresses at P5~P7. When the whole of the pressed location overlaps with the pad 16, the maximum stress decreases to tenth part of the maximum stress generated when the pressed location does not overlap with the pad 16.

As revealed by the experiment, to reduce the stress, it is sufficient if at least a part of the bump 24 overlaps with the pad 16 as illustrated in FIG. 18A and FIG. 18B. To greatly reduce the stress, the whole of the bump 24 is to overlap with the pad 16 as illustrated in FIG. 2A and FIG. 2B. When the pad 12 has a width W1 less than the diameter R1 of the bump 24 as illustrated in FIG. 17, it is sufficient if at least a part of the pad 12 overlaps with the pad 16. As described above, it is sufficient if the pad 16 overlaps with at least a smaller one of the pad 12 and the bump 24 in each of the pad 12/bump 24 pairs, the pad 12 and the bump 24 of the pad 12/bump 24 pair being bonded to each other. In the examples of FIG. 2A and FIG. 18A, the single pad 16 overlaps with the bumps 24. The pads 16 may be provided to correspond to the respective bumps 24.

The component to be flip-chip mounted may be one. The component to be flip-chip mounted is not limited to the semiconductor device 20 or the SAW device 22. For example, acoustic wave devices such as a boundary acoustic wave device and a Film Bulk Acoustic Resonator (FBAR) may be flip-chip mounted. The first through fourth embodiments can be applied to an electronic component including at least one component flip-chip mounted on the substrate 10.

Although the embodiments of the present invention have been described in detail, it is to be understood that the various change, substitutions, and alterations could be made hereto without departing from the spirit and scope of the invention.

What is claimed is:

1. An electronic component comprising:
   a substrate formed of ceramic and including pads on an upper surface thereof;
   a plurality of components flip-chip mounted on the upper surface of the substrate with bumps thereof being respectively bonded to the pads; and
   a plurality of additional films located on a lower surface of the substrate and overlapping with the pads that are bonded to the bumps with respect to each of pairs of the pad and the bump that are bonded together to mount the plurality of components, the plurality of additional films thereby overlapping all of the pairs of the pad and the bump that are bonded together,
   wherein
   the plurality of additional films are provided to correspond to the plurality of components, respectively, and
   each of the plurality of additional films overlaps with a whole of the pads that are bonded to the bumps of corresponding component and is smaller than the corresponding component.

2. The electronic component according to claim 1, wherein the plurality of additional films are formed of a metal.

3. A method of fabricating an electronic component comprising:
   forming a plurality of additional films on a lower surface of a substrate formed of ceramic, the substrate having pads on an upper surface thereof; and
   flip-chip mounting a plurality of components on the upper surface of the substrate with bumps of the plurality of components being respectively bonded to said pads on the upper surface of the substrate such that the plurality of additional films overlap with the pads that are bonded to the bumps with respect to each of pairs of the pad and the bump that are bonded together to mount the plurality of components, said additional films thereby overlapping all of the pairs of the pad and the bump that are bonded together,
   wherein
   the flip-chip mounting of the plurality of components includes flip-chip mounting the plurality of components to correspond to the plurality of additional films respectively, each of the plurality of additional films overlaps with a whole of the pads that are bonded to the bumps of corresponding component and is smaller than the corresponding component.

4. The method according to claim 3, wherein the flip-chip mounting of the plurality of components include flip-chip mounting the plurality of components by vibrating the plurality of components in a direction to which the upper surface of the substrate spreads with use of ultrasonic waves.

* * * * *